(12) United States Patent
Hsiao et al.

(10) Patent No.: US 11,935,780 B2
(45) Date of Patent: Mar. 19, 2024

(54) SEMICONDUCTOR STRUCTURE AND MANUFACTURING METHOD THEREOF

(71) Applicant: NANYA TECHNOLOGY CORPORATION, New Taipei (TW)

(72) Inventors: Chuan-Lin Hsiao, Taoyuan (TW); Wei-Ming Liao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 180 days.

(21) Appl. No.: 17/454,616

(22) Filed: Nov. 11, 2021

(65) Prior Publication Data
US 2023/0141995 A1 May 11, 2023

(51) Int. Cl.
*H01L 21/762* (2006.01)
*H01L 29/06* (2006.01)
*H10B 12/00* (2023.01)

(52) U.S. Cl.
CPC .... *H01L 21/76237* (2013.01); *H01L 29/0638* (2013.01); *H01L 29/0649* (2013.01); *H10B 12/00* (2023.02)

(58) Field of Classification Search
CPC ........... H01L 29/0638; H01L 21/76237; H01L 29/0649; H01L 21/823412; H01L 29/0653; H01L 21/76224; H01L 21/823481; H01L 29/66; H01L 27/092; H01L 29/407; H01L 29/1083; H01L 29/408; H01L 21/76229; H01L 29/7827; H01L 21/31111; H01L 21/761; H01L 29/4236; H01L 29/401; H01L 21/76283; H01L 27/0629; H01L 23/5222; H01L 28/75; H10B 12/01; H10B 12/053; H10B 12/34; H10B 12/315; H10B 12/31; H10B 12/488; H10B 12/0335; H10B 51/30; H01G 4/008

USPC ................. 257/374, 369, E21.642, E21.689, 257/E27.081, E21.547, E21.548; 438/425, 424, 400, 694, 241, 258

See application file for complete search history.

(56) References Cited

U.S. PATENT DOCUMENTS

| | | | |
|---|---|---|---|
| 6,140,691 A | 10/2000 | Gardner et al. | |
| 6,287,914 B1 * | 9/2001 | Uchiyama | H10B 12/482 438/738 |
| 6,508,277 B1 * | 1/2003 | Imes | F16L 11/16 138/135 |
| 9,530,840 B2 | 12/2016 | Kwon | |
| 9,881,918 B1 * | 1/2018 | Huang | H01L 21/324 |
| 2002/0022357 A1 * | 2/2002 | Iijima | H01L 21/02183 438/622 |
| 2002/0094610 A1 * | 7/2002 | Enomoto | H01L 21/76831 257/E21.654 |
| 2003/0040183 A1 * | 2/2003 | Kujirai | H01L 29/4941 257/E21.654 |
| 2010/0237432 A1 * | 9/2010 | Takeoka | H01L 21/823878 257/E21.546 |

(Continued)

*Primary Examiner* — Mouloucoulaye Inoussa
(74) *Attorney, Agent, or Firm* — CKC & Partners Co., LLC

(57) ABSTRACT

A manufacturing method of a semiconductor structure includes: etching a substrate such that the substrate has a first top surface and a second top surface higher than the first top surface; implanting the first top surface of the substrate by boron to increase a p-type concentration of the first top surface of the substrate; forming a first dielectric layer on the substrate; and forming a second dielectric layer on the first dielectric layer.

10 Claims, 8 Drawing Sheets

(56) References Cited

U.S. PATENT DOCUMENTS

| | | | |
|---|---|---|---|
| 2012/0187470 A1* | 7/2012 | Kim | H01L 29/40114 |
| | | | 257/E29.304 |
| 2014/0291771 A1 | 10/2014 | Schmid et al. | |
| 2017/0317086 A1* | 11/2017 | Nobuto | H01L 21/28556 |
| 2018/0175045 A1* | 6/2018 | Lee | H01L 23/528 |
| 2020/0350319 A1* | 11/2020 | Yoon | H10B 12/09 |

* cited by examiner

SEMICONDUCTOR STRUCTURE AND MANUFACTURING METHOD THEREOF

BACKGROUND

Field of Invention

The present disclosure relates to a semiconductor structure and a manufacturing method of the semiconductor structure.

Description of Related Art

In general, the recessed access device (RAD) is used in the dynamic random-access memory (DRAM). When a portion of the recessed access device is activated, leakage may be generated. The leakage may be passed to another portion, which is not activated, of the recessed access device, and the leakage may reduce the performance of the recessed access device. Furthermore, the leakage may make the recessed access device fail when the recessed access device is under the process of the margin test.

SUMMARY

An aspect of the present disclosure is related to a semiconductor structure.

According to an embodiment of the present disclosure, a semiconductor structure includes a substrate, a first dielectric layer and a second dielectric layer. The substrate has a first top surface and a second top surface. The first top surface of the substrate is implanted by boron to increase a p-type concentration of the first top surface of the substrate. The first dielectric layer is located on the first top surface of the substrate. The second dielectric layer is located on the first dielectric layer.

In one embodiment of the present disclosure, the second top surface of the substrate is substantially coplanar with a top surface of the second dielectric layer.

In one embodiment of the present disclosure, a distance from the second top surface to the first top surface is greater than a distance from the first top surface to a bottom surface of the substrate.

In one embodiment of the present disclosure, a thickness of the second dielectric layer is greater than a thickness of the first dielectric layer.

In one embodiment of the present disclosure, the substrate has a sidewall adjoining the first top surface and the second top surface. The first top surface, the sidewall and the second top surface define a stepped structure.

In one embodiment of the present disclosure, the first dielectric layer extends to the sidewall of the substrate.

In one embodiment of the present disclosure, the sidewall of the substrate is tilted relative to the first top surface and the second top surface of the substrate.

In one embodiment of the present disclosure, a width of the second top surface is greater than a width of the first top surface.

In one embodiment of the present disclosure, the substrate is made of a material that includes silicon.

In one embodiment of the present disclosure, the first dielectric layer and the second dielectric layer have the same material.

Another aspect of the present disclosure is related to a manufacturing method of a semiconductor structure.

According to an embodiment of the present disclosure, a manufacturing method of a semiconductor structure includes: etching a substrate such that the substrate has a first top surface and a second top surface higher than the first top surface; implanting the first top surface of the substrate by boron to increase a p-type concentration of the first top surface of the substrate; forming a first dielectric layer on the substrate; and forming a second dielectric layer on the first dielectric layer.

In one embodiment of the present disclosure, the method further includes etching the first dielectric layer and the second dielectric layer such that the second top surface of the substrate is substantially coplanar with a top surface of the second dielectric layer.

In one embodiment of the present disclosure, the method further includes prior to etching the substrate, forming a mask layer on the substrate to expose a portion of the substrate.

In one embodiment of the present disclosure, the method further includes removing the mask layer after etching the substrate and prior to forming the first dielectric layer.

In one embodiment of the present disclosure, etching the substrate is performed such that a distance from the second top surface to the first top surface is greater than a distance from the first top surface to a bottom surface of the substrate.

In one embodiment of the present disclosure, etching the substrate is performed such that the first top surface, a sidewall of the substrate and the second top surface define a stepped structure.

In one embodiment of the present disclosure, the first dielectric layer is formed by deposition.

In one embodiment of the present disclosure, forming the second dielectric layer is performed such that a top surface of the second dielectric layer is substantially coplanar with a top surface of the first dielectric layer located on the second top surface of the substrate.

In the aforementioned embodiments of the present disclosure, since the first top surface of the substrate is implanted by the boron to increase the p-type concentration, the leakage may be blocked by the first top surface of the substrate such that the leakage is unable to diffuse to other portions of the substrate. As a result, performing the process of implanting the first top surface of the substrate by boron may improve the performance of the semiconductor structure. In addition, since the first top surface of the substrate is implanted by the boron to block the leakage, the semiconductor structure may not be failed when the semiconductor structure is under the process of the margin test.

DETAILED DESCRIPTION

Figure 1:
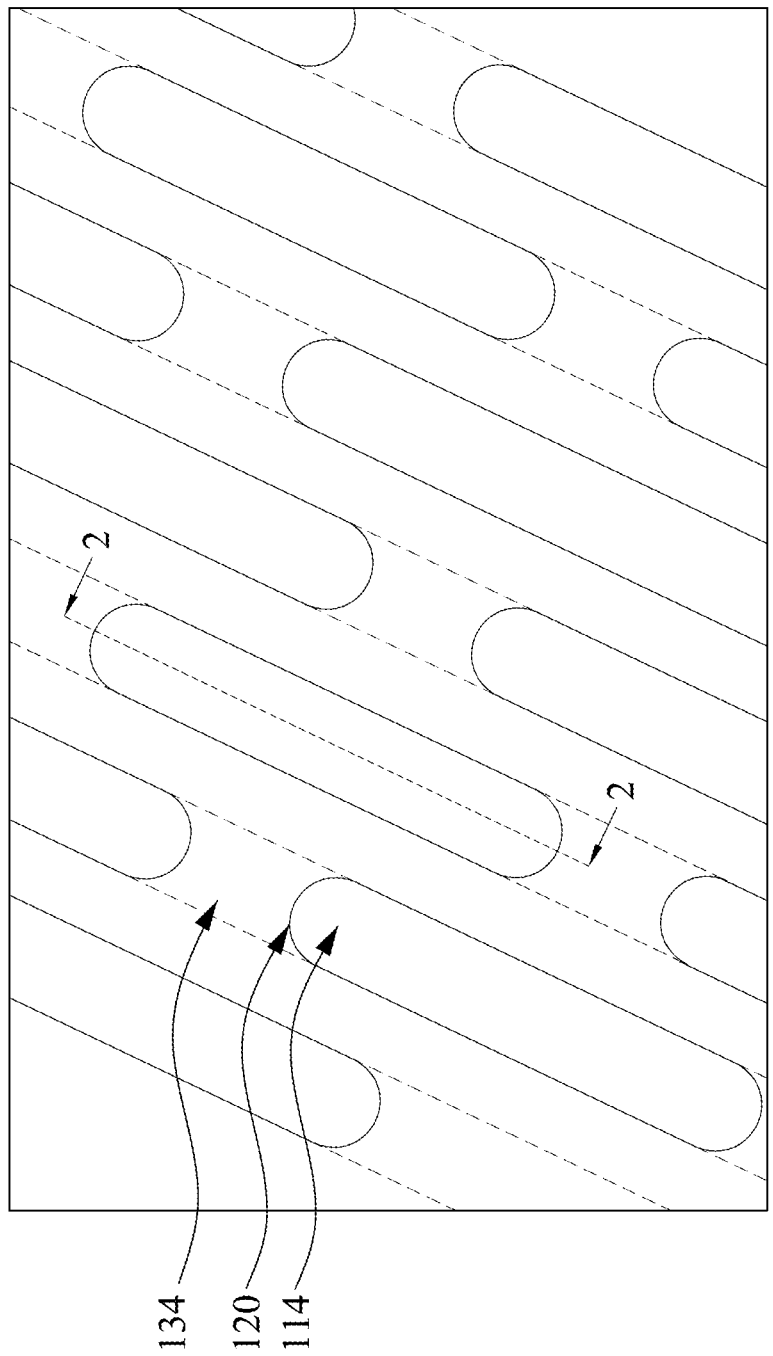
FIG. 1 illustrates a top view of a semiconductor structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "front," "back" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
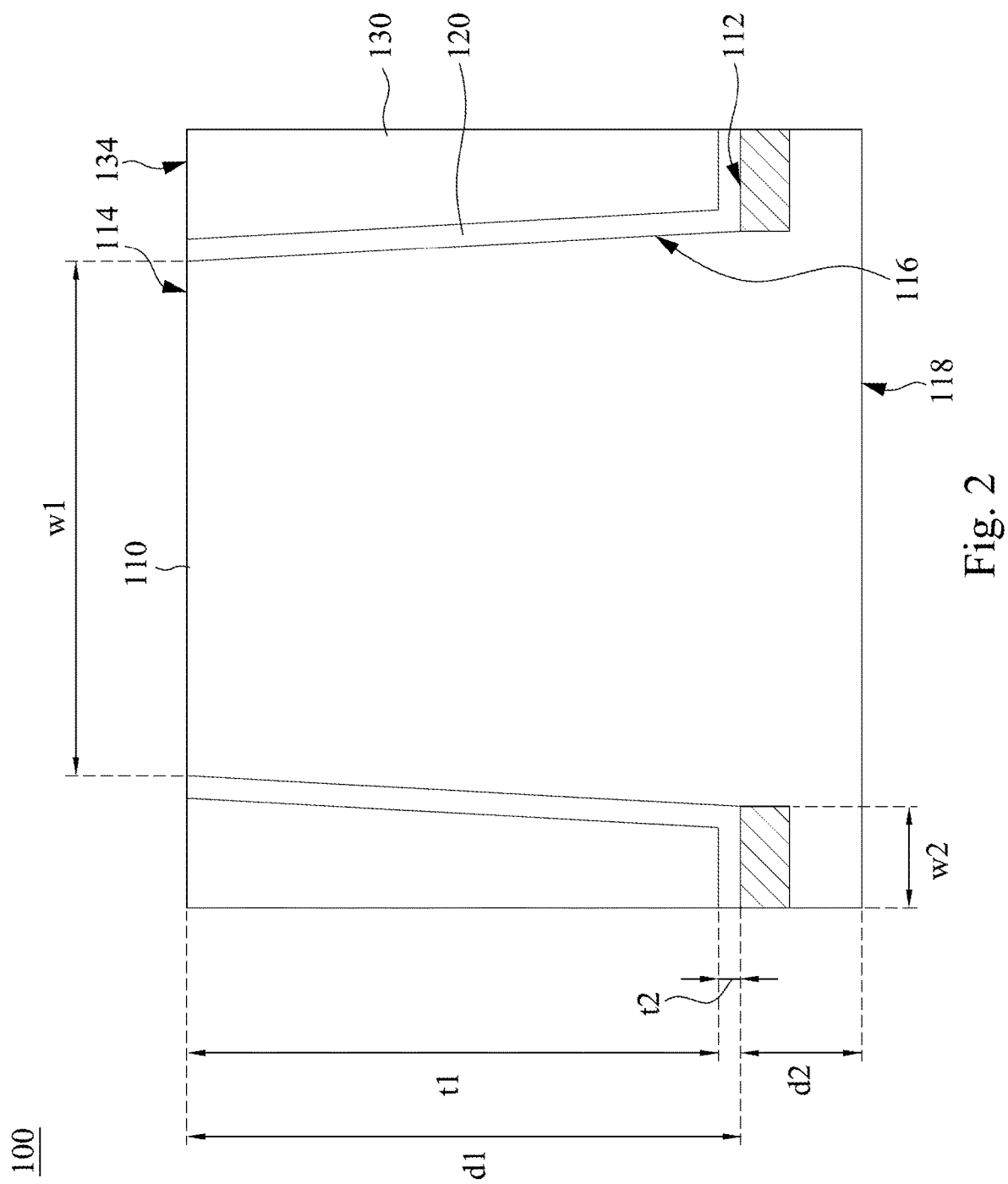
FIG. 2 illustrates a cross-sectional view of the semiconductor structure of FIG. 1 along a line segment.

FIG. 1 illustrates a top view of a semiconductor structure 100 according to one embodiment of the present disclosure. FIG. 2 illustrates a cross-sectional view of the semiconductor structure 100 of FIG. 1 along a line segment 2-2. Referring to both FIG. 1 and FIG. 2, the semiconductor structure 100 includes a substrate 110, a first dielectric layer 120 and a second dielectric layer 130. In some embodiments, the substrate 110 may be made of a material that includes silicon. The substrate 110 has a first top surface 112, a second top surface 114, a sidewall 116 and a bottom surface 118. The second top surface 114 is higher than the first top surface 112, and the sidewall 116 adjoins the first top surface 112 and the second top surface 114. That is noted that the first top surface 112 of the substrate 110 is implanted by boron to increase a p-type concentration of the first top surface 112 of the substrate 110.

Specifically, the first top surface 112 of the substrate 110 is implanted by the boron to increase the p-type concentration, so the leakage may be blocked by the first top surface 112 of the substrate 110 such that the leakage is unable to diffuse to other portions of the substrate 110. The performance of the semiconductor structure 100 will be improved. In addition, since the first top surface 112 of the substrate 110 is implanted by the boron to block the leakage, the semiconductor structure 100 may not be failed when the semiconductor structure 100 is under the process of the margin test.

In addition, the first dielectric layer 120 is located on the first top surface 112 of the substrate 110 and extends to the sidewall 116 of the substrate 110. The second dielectric layer 130 is located on the first dielectric layer 120. For example, a combination of the first dielectric layer 120 and the second dielectric layer 130 may be viewed as a shallow trench isolation to provide an isolation effect to an active area of the substrate 110. Moreover, a thickness t1 of the second dielectric layer 130 is greater than a thickness t2 of the first dielectric layer 120. A width w1 of the second top surface 114 of the substrate 110 is greater than a width w2 of the first top surface 112 of the substrate 110. The first dielectric layer 120 and the second dielectric layer 130 may have the same material, such as oxide.

In some embodiments, the second top surface 114 of the substrate 110 is substantially coplanar with a top surface 134 of the second dielectric layer 130. A distance d1 from the second top surface 114 of the substrate 110 to the first top surface 112 of the substrate 110 is greater than a distance d2 from the first top surface 112 of the substrate 110 to the bottom surface 118 of the substrate 110. The sidewall 116 of the substrate 110 is tilted relative to the first top surface 112 and the second top surface 114 of the substrate 110, and the first top surface 112, the sidewall 116 and the second top surface 114 define a stepped structure.

In the following description, a manufacturing method of a semiconductor structure will be described. It is to be noted that the connection relationship of the aforementioned elements will not be repeated.

Figure 3:
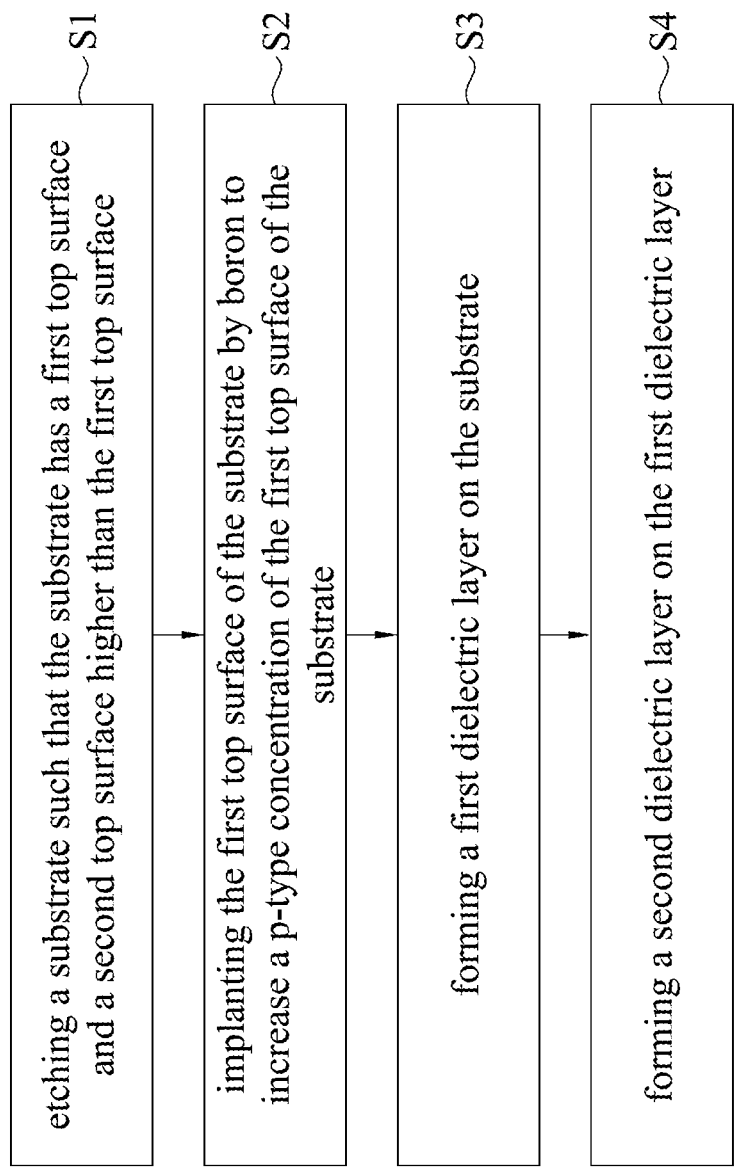
FIG. 3 illustrates a flow chart of a manufacturing method of a semiconductor structure according to one embodiment of the present disclosure.
Figure 4:
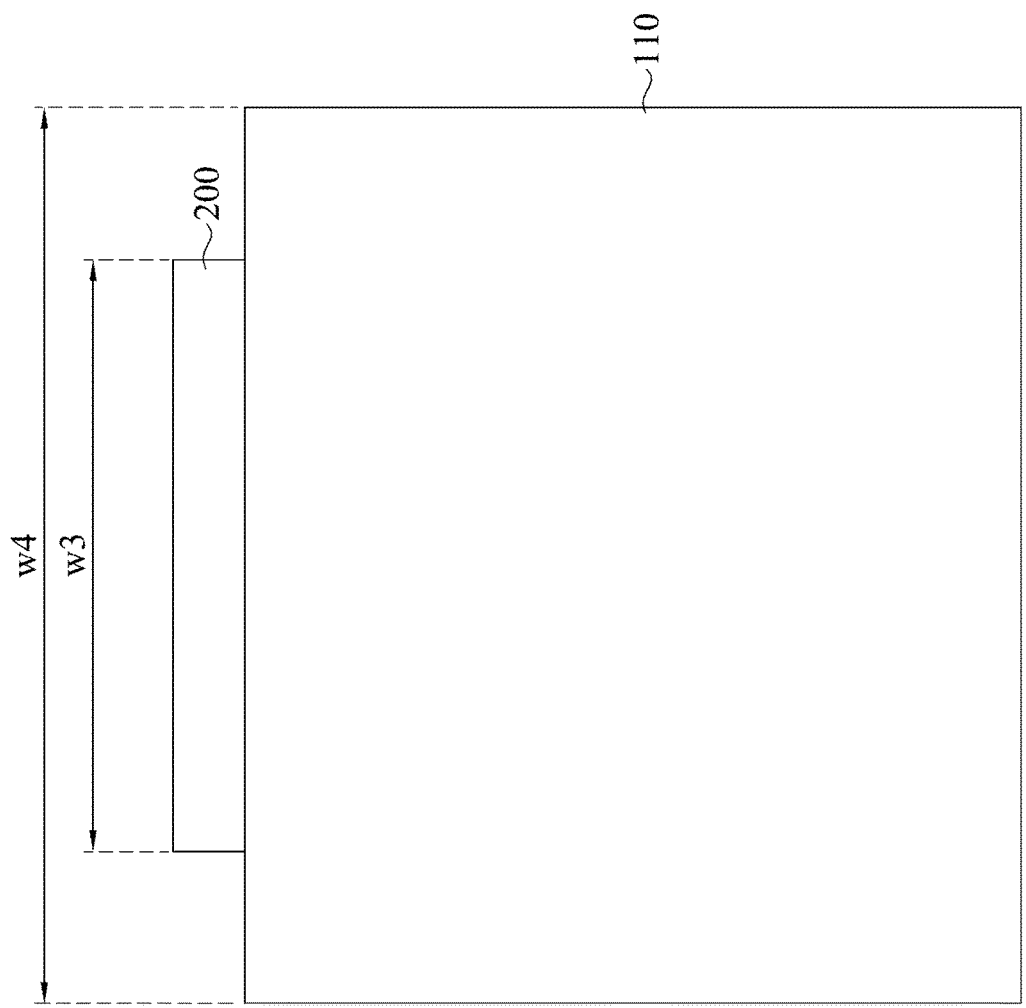
FIG. 4 to FIG. 8 illustrate cross-sectional views at various steps of a manufacturing method of a semiconductor structure according to one embodiment of the present disclosure.
Figure 5:
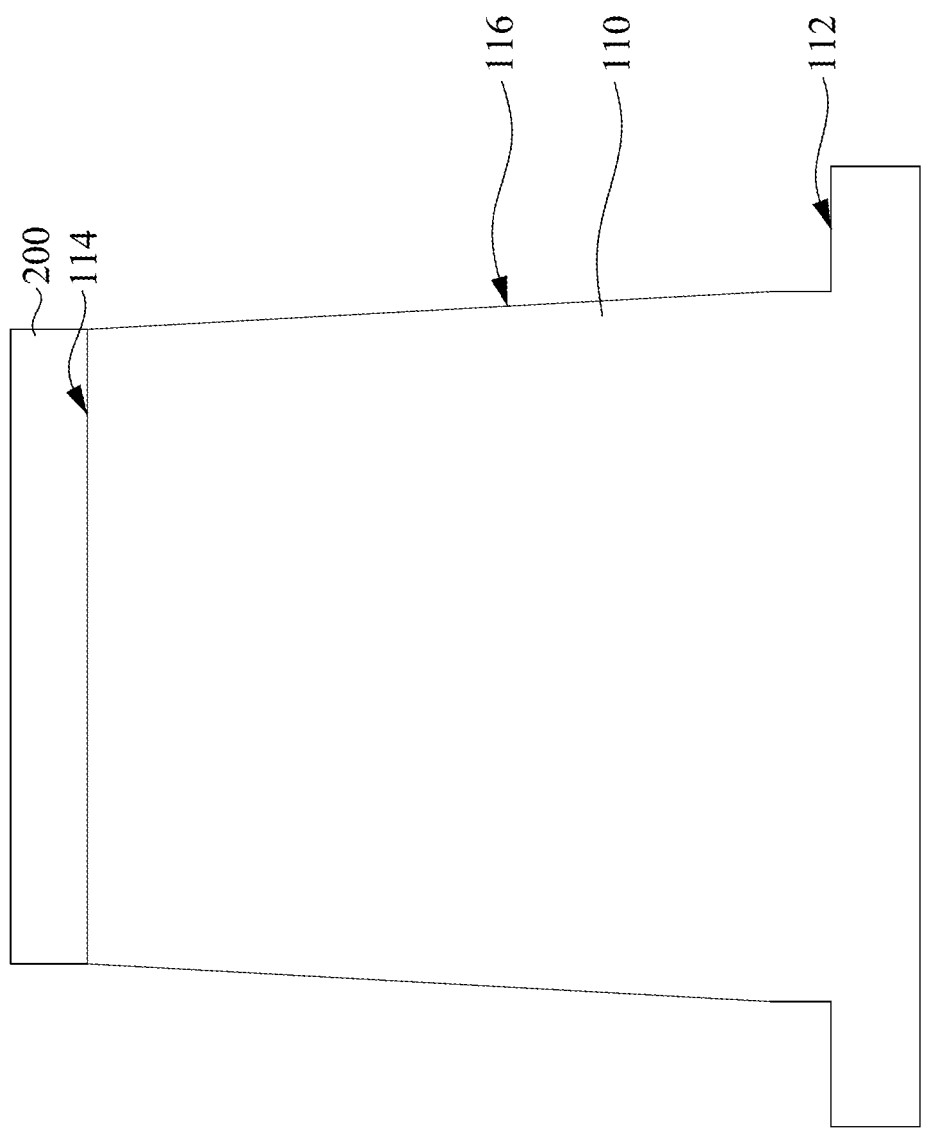

FIG. 3 illustrates a flow chart of a manufacturing method of a semiconductor structure according to one embodiment of the present disclosure. The manufacturing method of the semiconductor structure includes steps as outlined below. In step S1, a substrate is etched such that the substrate has a first top surface and a second top surface higher than the first top surface. In step S2, the first top surface of the substrate is implanted by boron to increase a p-type concentration of the first top surface of the substrate. In step S3, a first dielectric layer is formed on the substrate. In step S4, a second dielectric layer is formed on the first dielectric layer. In the following description, the aforementioned steps will be described in detail.

FIG. 4 to FIG. 8 illustrate cross-sectional views at various steps of a manufacturing method of a semiconductor structure according to one embodiment of the present disclosure. Referring to both FIG. 4 and FIG. 5, the manufacturing method further includes forming a mask layer 200 on the substrate 110 to expose a portion of the substrate 110. A width w3 of the mask layer 200 is different from a width w4 of the substrate 110. For example, the width w3 of the mask layer 200 is less than the width w4 of the substrate 110. After the mask layer 200 is formed on the substrate 110, the substrate 110 is etched such that the substrate 110 has the first top surface 112, the second top surface 114 and the sidewall 116. The second top surface 114 is higher than the first top surface 112. The first top surface 112, the sidewall 116 and the second top surface 114 of the substrate 110 define a stepped structure. In some embodiments, the sidewall 116 of the substrate 110 is tilted relative to the first top surface 112 and the second top surface 114 of the substrate 110.

Figure 6:
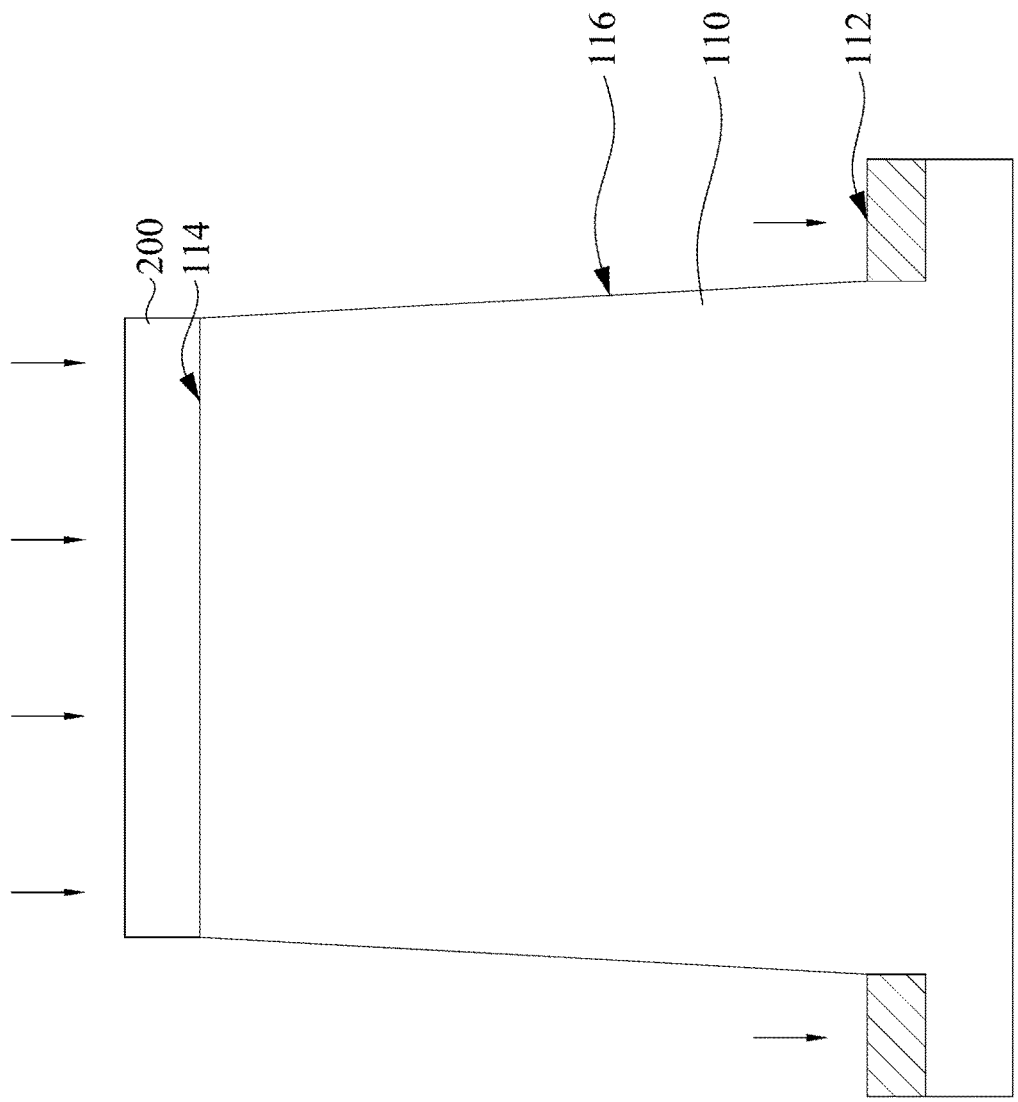
Figure 7:
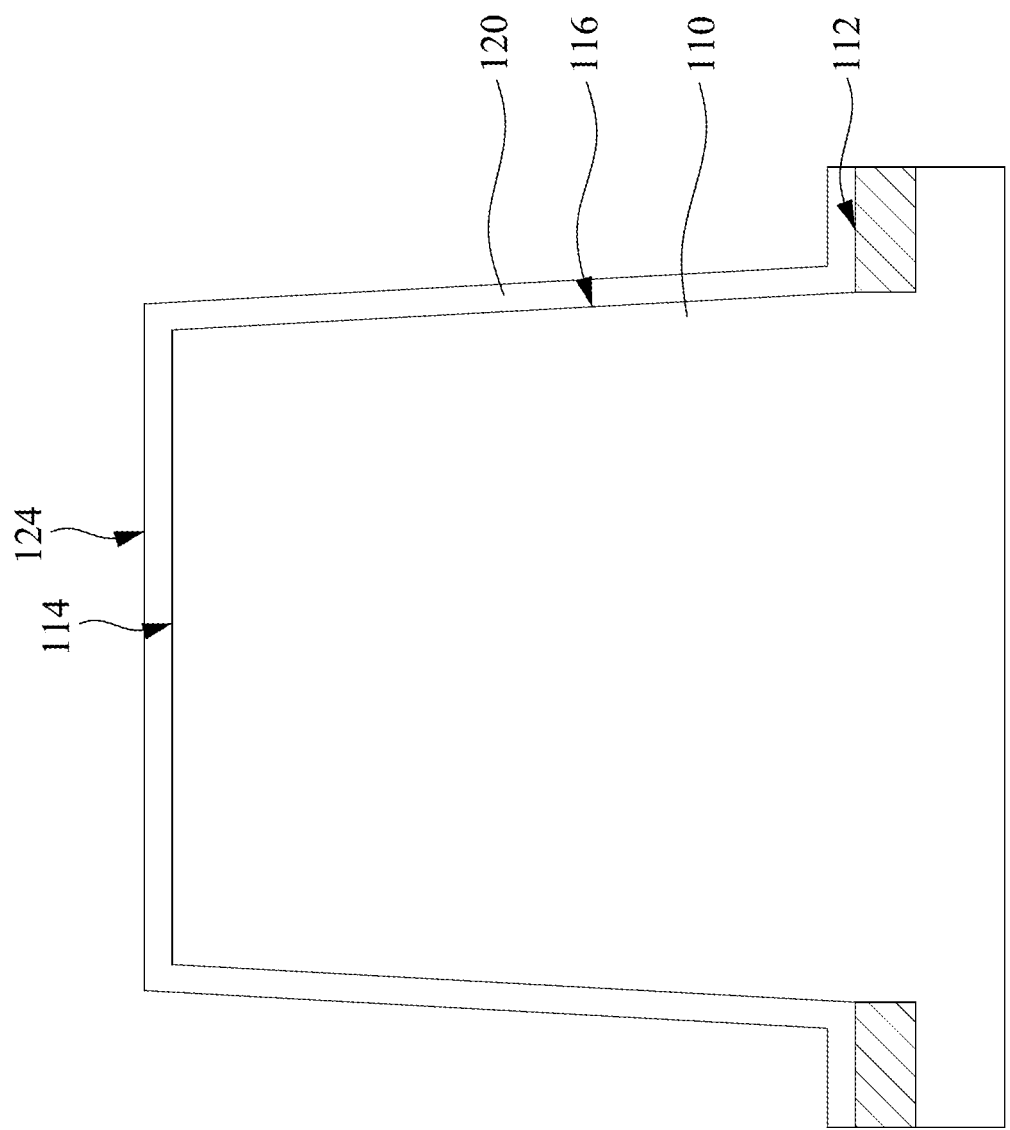

Referring to both FIG. 6 and FIG. 7, after the substrate 110 is etched, the first top surface 112 of the substrate 110 is implanted by boron to increase the p-type concentration of the first top surface 112 of the substrate 110. Since the first top surface 112 of the substrate 110 is implanted by the boron, the leakage may be blocked by the first top surface 112 of the substrate 110 such that the leakage is unable to diffuse to other portions of the substrate 110. After the first top surface 112 of the substrate 110 is implanted, the mask layer 200 is removed, and the first dielectric layer 120 is formed on the first top surface 112, the sidewall 116 and the second top surface 114 of the substrate 110. In some embodiments, the first dielectric layer 120 is formed by deposition such that the first dielectric layer 120 is conformally formed on the substrate 110.

Figure 8:
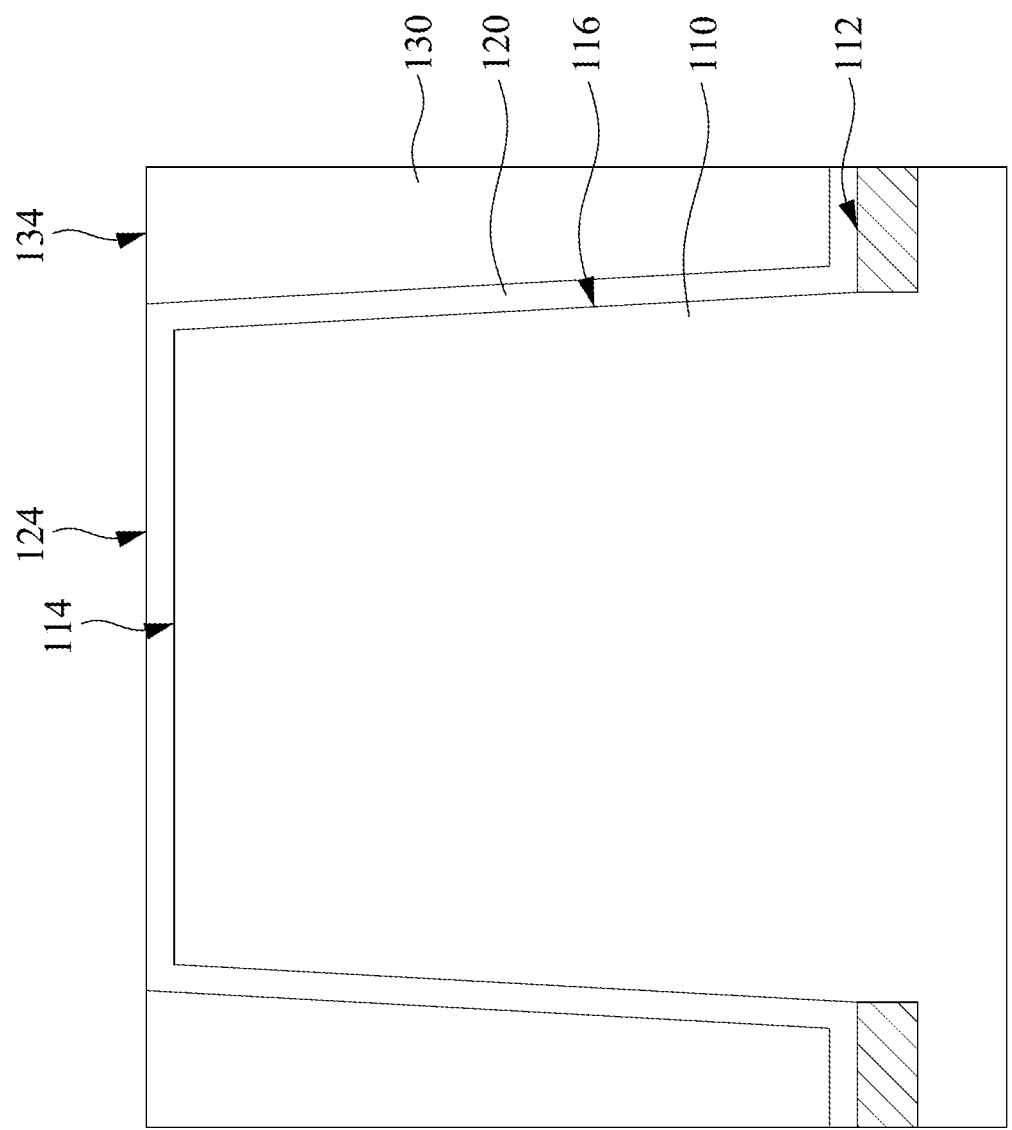

Referring to FIG. 8, after the first dielectric layer 120 is formed on the substrate 110, the second dielectric layer 130 is formed on the first dielectric layer 120 located on the first top surface 112 and the sidewall 116 of the substrate 110. In some embodiments, forming the second dielectric layer 130 is performed such that a top surface 134 of the second dielectric layer 130 is substantially coplanar with a top surface 124 of the first dielectric layer 120 located on the second top surface 114 of the substrate 110.

Referring back to FIG. 2, after the second dielectric layer 130 is formed on the first dielectric layer 120, the manufacturing method further includes etching the first dielectric layer 120 and the second dielectric layer 130 such that the second top surface 114 of the substrate 110 is substantially coplanar with the top surface 134 of the second dielectric layer 130. In some embodiments, the distance d1 from the second top surface 114 of the substrate 110 to the first top surface 112 of the substrate 110 is greater than the distance d2 from the first top surface 112 of the substrate 110 to the bottom surface 118 of the substrate 110.

In summary, since the first top surface of the substrate is implanted by the boron to increase the p-type concentration, the leakage may be blocked by the first top surface of the substrate such that the leakage is unable to diffuse to other portions of the substrate. As a result, performing the process of implanting the first top surface of the substrate by boron may improve the performance of the semiconductor structure. In addition, since the first top surface of the substrate is implanted by the boron to block the leakage, the semiconductor structure may not be failed when the semiconductor structure is under the process of the margin test.

Although the present disclosure has been described in considerable detail with reference to certain embodiments thereof, other embodiments are possible. Therefore, the spirit and scope of the appended claims should not be limited to the description of the embodiments contained herein. In view of the foregoing, it is intended that the present disclosure covers modifications and variations of this disclosure provided they fall within the scope of the following claims.

What is claimed is:

1. A semiconductor structure, comprising:
    a semiconductor substrate having a first top surface and a second top surface higher than the first top surface, wherein the first top surface of the semiconductor substrate is implanted by boron to increase a p-type concentration of the first top surface of the semiconductor substrate to form an implanted region in contact with the first top surface, wherein the implanted region is not higher than the first top surface;
    a first dielectric layer located on the first top surface of the semiconductor substrate; and
    a second dielectric layer located on the first dielectric layer.

2. The semiconductor structure of claim 1, wherein the second top surface of the semiconductor substrate is substantially coplanar with a top surface of the second dielectric layer.

3. The semiconductor structure of claim 1, wherein a distance from the second top surface to the first top surface is greater than a distance from the first top surface to a bottom surface of the semiconductor substrate.

4. The semiconductor structure of claim 1, wherein a thickness of the second dielectric layer is greater than a thickness of the first dielectric layer.

5. The semiconductor structure of claim 1, wherein the semiconductor substrate has a sidewall adjoining the first top surface and the second top surface, and the first top surface, the sidewall and the second top surface define a stepped structure.

6. The semiconductor structure of claim 5, wherein the first dielectric layer extends to the sidewall of the semiconductor substrate.

7. The semiconductor structure of claim 5, wherein the sidewall of the semiconductor substrate is tilted relative to the first top surface and the second top surface of the semiconductor substrate.

8. The semiconductor structure of claim 1, wherein a width of the second top surface is greater than a width of the first top surface.

9. The semiconductor structure of claim 1, wherein the semiconductor substrate is made of a material that comprises silicon.

10. The semiconductor structure of claim 1, wherein the first dielectric layer and the second dielectric layer have a same material.

* * * * *